United States Patent
Kimball et al.

(10) Patent No.: US 6,771,503 B2
(45) Date of Patent: Aug. 3, 2004

(54) METHOD AND APPARATUS FOR MANAGING THERMAL ENERGY EMISSIONS OF A REMOVABLE MODULE IN A SET-TOP BOX

(75) Inventors: Steven Kimball, Leucadia, CA (US); Shiomo Ovadia, Yardley, CA (US); William J. Storti, Haverford, PA (US); Keith Sibley, Willow Grove, PA (US); Barry Falvo, Lower Providence, PA (US); Charles Herrmann, Elkins Park, PA (US)

(73) Assignee: General Instrument Corporation, Horsham, PA (US)

(*) Notice: Subject to any disclaimer, the term of this patent is extended or adjusted under 35 U.S.C. 154(b) by 0 days.

(21) Appl. No.: 10/205,953

(22) Filed: Jul. 26, 2002

(65) Prior Publication Data

US 2002/0186536 A1 Dec. 12, 2002

Related U.S. Application Data

(63) Continuation-in-part of application No. 09/450,342, filed on Nov. 29, 1999.

(51) Int. Cl.[7] ............................................. H05K 7/20
(52) U.S. Cl. .................. 361/704; 361/702; 361/714; 257/722
(58) Field of Search ................... 361/683, 665, 361/686, 687, 688–692, 704–710, 714–717, 719–720, 725, 727, 752, 253, 784, 790; 257/718–719, 722, 726–727; 364/708.1; 312/223.1, 223.2; 165/80.2, 80.3, 185; 174/16.3, 15.1, 252; 348/1–10, 12, 13; 455/4.1, 4.2, 5.1, 6.2, 6.3; 235/380, 382, 382.5; 340/825.33

(56) References Cited

FOREIGN PATENT DOCUMENTS

JP          409171540 A  *  6/1997  .......... G06K/17/00

OTHER PUBLICATIONS

An article "Circuit Card Cooling Enhancement Device" (IBM Technical Disclosure Bulletin 09, 1990, US; Issue 4, p. 103–104).*

* cited by examiner

*Primary Examiner*—Michael Datskovsky
(74) *Attorney, Agent, or Firm*—Steven L. Nichols; Ronald P. Kananen; Rader, Fishman & Grauer PLLC

(57) ABSTRACT

The port for a removable module of a set-top box in a cable television system incorporates guide members of a thermally conductive material to provide a new primary heat dissipation path to manage thermal energy generated by operation of the module. The guide members may also be used to guide the module into proper connection with a module connector which electrically connects the circuit on the module with the circuitry of the set-top box. The guide members may be attached to the chassis of the set-top box or integrally formed in the chassis. Thus, heat from the module is provide directly to the chassis of the set-top box from which it is released by convention into the ambient environment.

19 Claims, 3 Drawing Sheets

METHOD AND APPARATUS FOR MANAGING THERMAL ENERGY EMISSIONS OF A REMOVABLE MODULE IN A SET-TOP BOX

RELATED APPLICATIONS

The present application is a continuation-in-part application of U.S. application Ser. No. 09/450,342, filed Nov. 29, 1999 by Kimball et al., and which is incorporated herein by reference in its entirety.

FIELD OF THE INVENTION

The present invention relates to the field of cable television. More particularly, the present invention relates to the field of thermal energy management for thermal energy produced by set-top terminals used by individual subscribers within a cable television system.

BACKGROUND OF THE INVENTION

Cable television systems allow subscribers access to dozens or even hundreds of channels of television programming. This wide variety of programming accounts for the great popularity of cable television. Additionally, the current trend is for cable television systems to provide additional services such as premium channels, pay-per-view programming, video-on-demand programming and even internet access.

In advanced cable television systems, each subscriber is typically provided with a set-top terminal. The set-top terminal is a box of electronic equipment that is used to connect the subscriber's television, or other electronic equipment, to the cable television system. The set-top terminal processes the signal received from the cable television system to provide the services of the cable system to subscribers.

As the premium services of the cable television system expand, security techniques for those premium services become crucial to ensure that only subscribers who have paid for the premium services have access to them. For example, premium channels, such as some movie channels, are scrambled before transmission to prevent unauthorized reception and viewing of those channels. Subscribers who pay additional fees to receive the premium channel or channels are provided with the means to descramble and view the premium channel or channels.

There are many techniques for controlling the remote descrambling of scrambled television signals. Typically a system subscriber who has paid to receive the scrambled premium channel or channels is provided with a descrambler unit that is connected between the source of the television signal source (e.g., a cable feed or a satellite receiver) and the subscriber's television set. While this descrambler unit may be a self-contained unit, descrambling circuitry is frequently and preferably incorporated into the subscriber's set-top terminal.

Unfortunately, proprietary algorithms used by descrambling circuitry can frequently, with enough effort, be "broken" or duplicated by an unauthorized party. Thereafter, unauthorized means of descrambling the cable system's premium channels might be made available to subscribers. To avoid this, the operator of the cable system may need to periodically change the proprietary alogrithm used to scramble and descramble premium channels.

If the subscriber's descrambling circuitry is incorporated in a set-top terminal, the old descrambling circuitry must be removed and new descrambling circuitry inserted. To facilitate this process, removable modules that carry the descrambling circuitry can be provided to plug into a port of the set-top box. These removable modules are also known as point-of-deployment (POD) modules.

When the descrambling circuitry is to be changed or upgraded, the old removable module can be pulled from the set-top box, and a module with the new circuitry is inserted in the port. Other elements or programming of the set-top terminal which need to be updated periodically can also provided in the removable module.

A removable module, like that described above, typically has a programmable circuit that contains the proprietary algorithm used by the set-top box for decrypting or descrambling purposes. This programmable circuit typically includes a memory section, for example, Static Random Access Memory (SRAM) chips or the like, forming a confidential or secured portion of the removable module memory in which, for example, the proprietary algorithm can be stored.

The removable module may be about the size and shape of a credit card and is meant to be removed only when the cable television company providing the services decides to update or change the proprietary decrypting algorithm. Such a change may occur regularly as a security precaution, when improved security or other features become available for inclusion in the set-top boxes, or after the decrypting algorithm has been broken by an unauthorized user. Additionally, the inadvertent removal of the removable module typically renders the set-top box non-functional.

It is known to add a port in the top or in one side of a set-top box into which the removable module is plugged. However some problems arise when a removable module is mounted in a port in the side or top of a set-top box. For example, the removable module so mounted is easily accessible to children and others who may remove the module without the knowledge of the subscriber. The removable module so mounted is also susceptible to an inadvertent removal or bumping which can cause the set-top box to become non-functional.

Moreover, as noted above, the current trend is for the amount and diversity of services provided by cable television companies to expand to include, for example, the transmission of computer data, a greater quantity of television programming and, eventually, telephone calls. To accommodate the existing and new services, set-top terminals will eventually require many more ports than presently exist. This will reduce the space available for including a separate port for a removable module.

A solution to these problems is disclosed in U.S. Pat. No. 5,426,701 issued Jun. 20, 1995 to Herrmann et al. In that patent, a port for a removable module is located underneath the set-top box. Accessible from the rear of the set-top terminal, the credit-card shaped removable module is slid into a groove in the underside of the set-top terminal to plug into a port provided there. A substantial portion of the removable module may be inserted into the casing of the set-top terminal in order to plug the module into its port. Additionally, a door or access cover may be provided to completely enclosed the module in the housing of the set-top box by closing over the groove on the underside of the set-top terminal to cover the removable module after it is plugged into its port Placing the removable module underneath and, perhaps, inside the casing of the set-top terminal, however, contributes to other problems in the design of the set-top box.

Specifically, the electronic circuitry of the removable module inherently generates heat or thermal energy during operation. This thermal energy must be dissipated to prevent accumulation and overheating that may damage or be detrimental to the module or the set-top box. Adequate dissipation of thermal energy has been a problem in previous set-top boxes.

FIG. 1 shows a conventional thermal energy management scheme for a set-top box (105) that includes a removable module (100). As shown in FIG. 1, the removable module (100) is inserted in a port (104). Within the port (104), the module (100) is connected to a module connector (101). The module connector (101) is, in turn, connected to the printed wire assembly (PWA) (102), i.e., the circuitry, within the set-top box (105). The module connector (101) provides electronic communication between the module (100) and the circuitry (102) of the set-top box (105) so that the circuitry (102) of the set-top box (105) can make use of the data, such as a proprietary security algorithm, or processing capabilities of the module (100).

The module connector (101) also provides the primary path through which thermal energy is dissipated from the removable module (100). The physical connection between the module connector (101) and the module (100) provides a conduction path (110) over which thermal energy leaves the module (100).

The thermal energy next follows a second conduction path (111) from the module connector (101) into the printed wire assembly (102) of the set-top box (105). From the printed wire assembly (102), the thermal energy is released by convection (113) in to the ambient air within the set-top housing or chassis (103). The heat within the chassis may escape through convection (115) from the exterior of the chassis (103). Alternatively, the chassis (103) may include an exchange path (114), such as a vent in the chassis (103) with or without a fan, through which heat can escape from the interior of the chassis (103).

In addition to this primary heat dissipation path, thermal energy generated by the removable module (100) is secondarily dissipated through convection (112) into the ambient air within the set-top box chassis (103). Heat leaving the module (100) in this manner is then further dissipated by convection (115) from the exterior of the chassis (103) or through the exchange path (114).

This system for managing the thermal energy generated by the module (100), while operational, does not provide sufficient cooling of the module (100). Therefore, there is a need in the art for an improved method and apparatus for managing the thermal energy generated by the operation of a removable module in a set-top box of a cable television system.

SUMMARY OF THE INVENTION

It is an object of the present invention to meet the above-described needs and others. Specifically, it is an object of the present invention to provide an improved method and apparatus for managing the thermal energy generated by the operation of a removable module in a set-top box of a cable television system.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve these stated and other objects, the present invention may be embodied and described as a set-top box for use in a cable television system that includes a set-top box chassis; a removable module port for receiving a removable module therein and electrically connecting the removable module to the circuitry of the set-top box; and at least one guide member in the removable module port. The guide member or members are in physical contact with the removable module when the removable module is connected to the set-top box. The guide members are made of a thermally conductive material and provide a physical heat dissipation path from the exterior of the removable module to the set-top box chassis. Preferably, the physical contact between the guide members and the removable module is extensive enough that a majority of the heat generated by the removable module is dissipated through the guide members.

The at least one guide member is preferably two guide members located on top and bottom surfaces, respectively, of the removable module port. The guide members may be integrally formed in and from the chassis. Alternatively, the guide members may be attached to the chassis.

Additionally, the guide member may align and guide the removable module into proper connection with a module connector in the removable module port. This facilitates the insertion and connection of the module to the set-top box.

The removable module preferably includes a conductive paste between the heat generating components of the module and the exterior housing of the module. This provides a substantially uniform distribution of thermal energy on the exterior housing of the module.

The present invention also comprises the method of implementing the apparatus described above. Specifically, the present invention includes a method of managing thermal energy dissipation in a set-top box for use in a cable television system, where the set-top box has a removable module port for receiving a removable module therein. The method is performed by conducting thermal energy away from the removable module to a chassis of the set-top box through at least one guide member in the removable module port that is in physical contact with both the set-top box chassis and the removable module when the removable module is placed in the port.

BRIEF DESCRIPTION OF THE DRAWINGS

The accompanying drawings illustrate the present invention and are a part of the specification. Together with the following description, the drawings demonstrate and explain the principles of the present invention.

DETAILED DESCRIPTION OF THE PREFERRED EMBODIMENTS

Using the drawings, the preferred embodiments of the present invention will now be explained.

Figure 1:
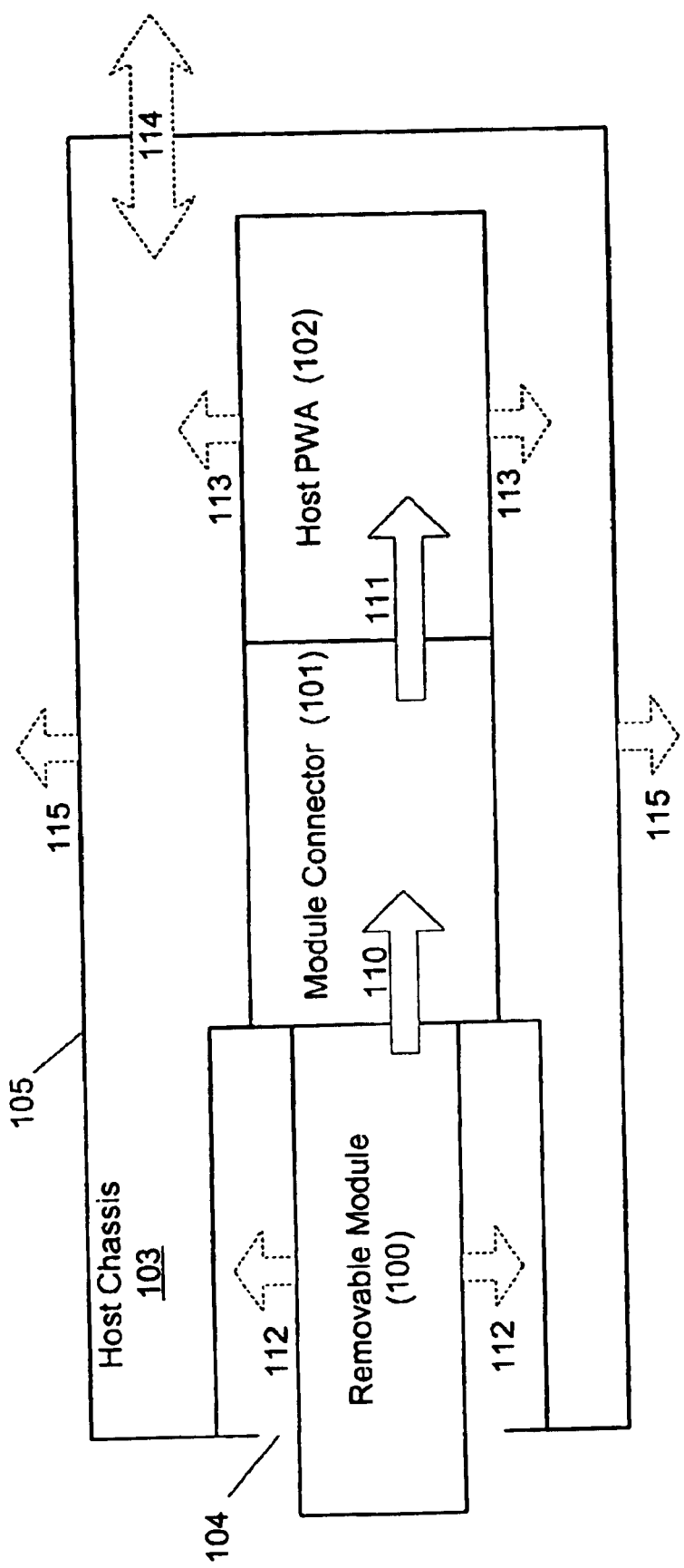
FIG. 1 is block diagram of a conventional thermal energy management system in a set-top box.
Figure 2:
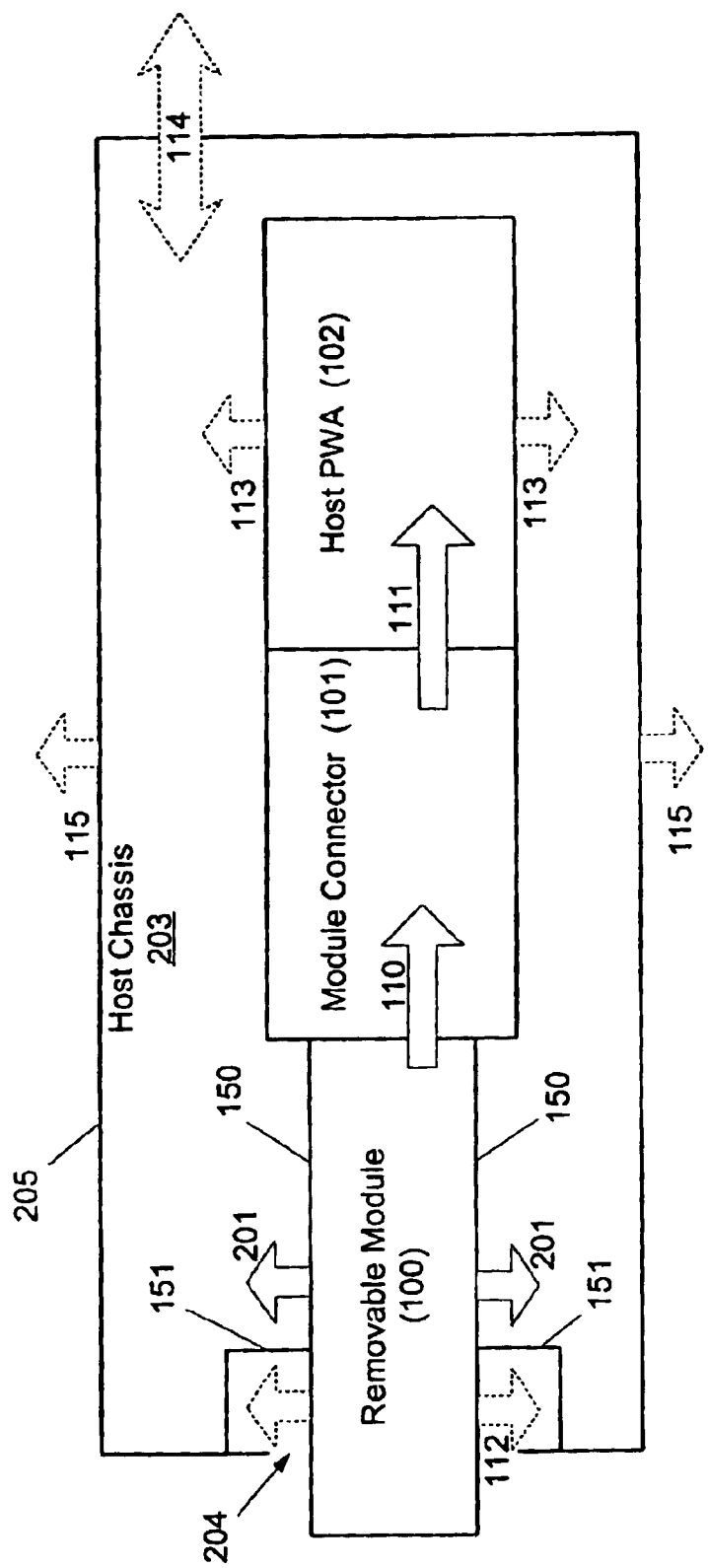
FIG. 2 is a block diagram of a first embodiment of a thermal energy management system in a set-top box according to the present invention.

FIG. 2 illustrates a first embodiment of a thermal energy management system in a set-top box according to the present invention. Elements in FIG. 2 which are similar to those in FIG. 1 are identically numbered. As shown in FIG. 2, a set-top box (205) for use with a cable television system is housed within a chassis (203). In the chassis (203) is a port (204) into which a removable module (100) can be plugged. The circuitry (102) of the set-top box (105) receives an input television signal from, for example, a cable or satellite television system, processes that signal and outputs a processed signal for use by a television set to which the set-top box (105) is connected.

As noted above, removable modules can be used to provide programming, security features or electronic components for the set-top box (205) that are readily replaceable. Any feature or component provided by the module (100) can be upgraded or replaced by simply replacing the module (100).

The port (204) for the removable module (100) includes a module connector (101). As described above, the module (100) is electronically connected to the printed wire assembly (102), i.e., the circuitry, of the set-top box (205) through the module connector (101). This allows the circuitry of the set-top box (205) to provide power to the module (100) and make use of any programming, algorithm or processing capability resident in the module (100).

While supplied with electrical power from the set-top terminal (205), the module (100) operates and thereby generates heat or thermal energy. As in the device shown in FIG. 1, there are several paths through which the thermal energy generated by the module (100) can be dissipated to maintain the module (100) and the set-top terminal (205) within an acceptable operating temperature range. For example, heat is conducted (10) from the module (100) through the module connector (101). This heat is, in turn conducted (111) to the circuitry (102) of the set-top box (205), released by convection (113) into the ambient air within the chassis (203) of the set-top box (205). Heat within the chassis (203) is released by convection (115) from the exterior of the chassis (203) or through an exchange path (114). The exchange path may include a vent, with or without a fan, in the chassis (203).

Alternatively, thermal energy is released by convection (112) from the exterior surface of the module (100) into the ambient air within the set-top box chassis (203). As described above, heat within the chassis (203) is then released by convection (15) from the exterior of the chassis (203) or through the exchange path (114).

In addition, the present invention provides additional paths for the release of thermal energy from the module (100). As shown in FIG. 2, the port (204) of the set-top box chassis (203) is formed to provide interior guide members (151). These members (151) serve two functions.

First, the guide members (151) each have a surface (150) which is adjacent to, and in physical contact with, the exterior of the removable module (100). Consequently, when the module (100) is inserted in the port (204), the guide members (151) contact the module (100) and thereby align the module (100) with the module connector (101). This facilitates the correct connection of the module (100) with the module connector (101).

Typically, the connection between the module (100) and the module connector (101) includes a series of pins that mate with pin receptacles on the other component. By aligning the module (100) with the module connector (101), the guide members (151) help prevent any damage or bending to the pins of the connection potentially caused when a user forces the module (100) against the module connector (101) without properly aligning the pins and pin receptacles of the connection.

Additionally, the guide members (151) provide an additional thermal energy transfer path (201) through which thermal energy is conducted away from the module (100). The guide members (151) may be an integral part of the chassis (203) of the set-top box (205). In such a case, both the guide members (151) and the chassis (203) are preferably made of a thermally conductive material, e.g., a metal or alloy.

Consequently, as the guide members (151) are in physical contact with the module (100) when the module is inserted in the port (204), thermal energy from the module (100) will be conducted (201) from the exterior surface of the module (100) through the guide members (151) and into the greater chassis (203). Because the chassis (203) is significantly larger and heavier than the module (100), the heat from the module (100) is expected to increase the operating temperature of the chassis (203) by only a negligible amount.

Preferably, the guide members (151) are in physical contact with a majority of the top and bottom side surfaces of the module (100). The more physical contact between the module (100) and the guide members (151), the larger and more effective is the thermal energy conduction path (201) away from the module (100). Guide members (151) may also be provided on the sides of the module (100) to provide additional physical contact. However, modules (100) are typically very thin, e.g., card-like, with minimal side surface area.

The thermal energy escaping from the module (100) into the chassis (103) via the conduction path (201) is then dissipated from the chassis (203) by convection (115) from the exterior surface of the chassis (203). The chassis (203) may also release heat by convention into the ambient air within the chassis (203) which can be released through the exchange (114).

In this way, the present invention provides a new primary heat dissipation path (201) for the module (100). This allows the module (100) to more easily maintain an acceptable operating temperature. Additionally, the new primary heat dissipation path (201) conducts heat directly into the set-top box chassis (203). Thus, the majority of heat dissipated from the module (100) tends to bypass the circuitry (102) of the set-top box (205). This allows the circuitry (102) of the set-top box (205) to more readily maintain an acceptable operating temperature.

In the conventional thermal energy management system, illustrated in FIG. 1, the internal circuitry of the set-top box was required to act as a conductor for the majority of heat dissipated from the removable module. Thus, the present invention can improve the operating conditions and thermal energy management within a set-top terminal as compared to conventional systems.

Figure 3:
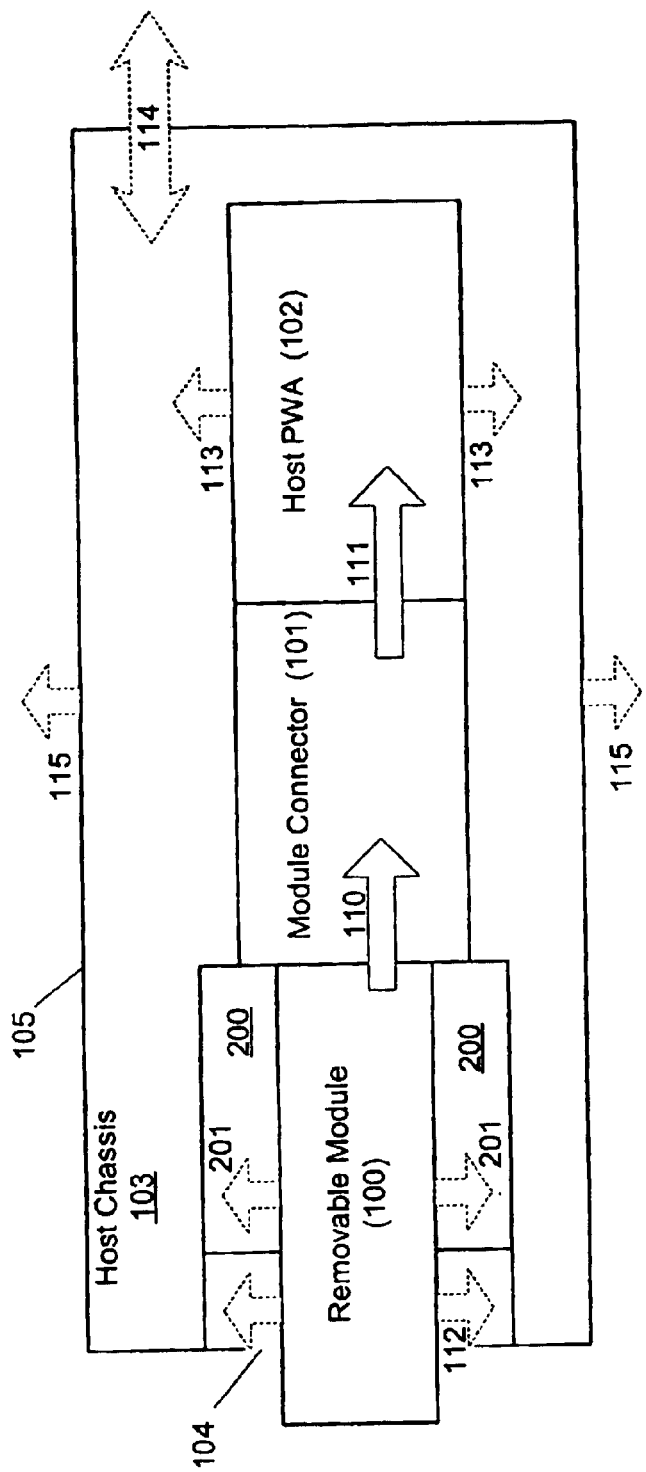
FIG. 3 is a block diagram of a second embodiment of a thermal energy management system in a set-top box according to the present invention.

FIG. 3 illustrates a second embodiment of a thermal energy management system for a set-top box according to the present invention. As shown in FIG. 3, the chassis (103) of the set-top box (105) conforms to that found in the conventional system of FIG. 1. However, within the port (104) for the removable module (100), guide members (200) are provided.

These guide members (200) perform the same functions as the guide members (151) described above in connection with FIG. 2. The guide members (200) may contact the exterior of the module (100) to guide the module (100) into proper connection with the module connector (101).

Additionally, the guide members are made of a thermally conductive material, e.g., metal, metal alloy, ceramic, etc., and are in physical contact with both the exterior of the module (100) and the chassis (103) of the set-top box (105). Consequently, the guide members (200) provide a thermal conduction path (201) from the exterior of the module (100) to the chassis (103) of the set-top box (105) as did the guide members (151) described in connection with FIG. 2.

Consequently, the guide members (200) which are attached to the chassis (103) and in physical contact with the module (100) provide the same advantages as the guide members (151) described above. Specifically, the guide members (200) allow heat from the module (100) to be readily dissipated without passing through the internal circuitry (102) of the set-top terminal (105).

The use of the guide members (151, 200) of the present invention to conduct heat away from the module can be enhanced by modifying the design of the module (100). For example, the module (100) should be designed to achieve a uniform temperature distribution across its surface, which is preferably metallic, for efficient conduction of thermal energy into the guide members (151, 200). Additionally, the removable module (100) typically comprises various components, for example integrated circuits and a battery, that have different power dissipations. A highly conductive thermal paste can be placed inside the housing of the removable module between these various components and the housing to help generate a substantially uniform heat distribution on the exterior surface of the module housing.

Moreover, the components of the module (100) which generate the most heat should be placed nearest the end of the module (100) that connects to the module connector (101). Components of the module (100) that generate little heat, such as a battery, should be placed at the other end of the module (100). This arrangement can provide a shorter thermal path for heat from the module components that produce the most heat into the guide members (151, 200).

As described above, the present invention provides a set-top box in which generated thermal energy can be more effectively managed and dissipated than in prior art devices. The present invention contributes, therefore, to providing both longer-lasting and more reliable set-top boxes than previously available.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A set-top box for use in a cable or satellite television system comprising:
   a set-top box chassis;
   a removable module port in said set-top box for receiving a removable module therein and electrically connecting said removable module to circuitry of said set-top box; and
   at least one guide member in said removable module port, said at least one guide member being in physical contact with both said chassis and said removable module when said removable module is in said removable module port;
   wherein said at least one guide member is made of a thermally conductive material and provides a physical heat dissipation path from an exterior of said removable module to said set-top box chassis; and
   wherein said at least one guide member is integrally formed in and from said chassis.

2. The set-top box of claim 1, wherein said at least one guide member is two guide members located on a top and bottom surfaces, respectively, of said removable module port.

3. The set-top box of claim 1, wherein said at least one guide member is attached to said chassis.

4. The set-top box of claim 1, wherein said at least one guide member aligns and guides said removable module into proper connection with a module connector in said port.

5. The set-top box of claim 1, wherein said physical contact between said at least one guide member and said removable module is extensive enough that a majority of heat generated by said removable module is dissipated through said at least one guide member.

6. The set-top box of claim 1, wherein said removable module comprises a conductive paste between heat generating components of said module and an exterior housing of said module so as to provide a substantially uniform distribution of thermal energy on said exterior housing of said module.

7. The set-top box of claim 1, wherein said set-top box does not comprise a cooling fan or heat sink for said module apart from said guide member and said chassis.

8. A method of managing thermal energy dissipation in a set-top box for use in a cable television system, where said set-top box has a removable module port for receiving a removable module therein, said port electrically connecting said removable module to circuitry of said set-top box, the method comprising:
   conducting thermal energy away from said removable module to a chassis of said set-top box through at least one guide member in said removable module port that is in physical contact with both said set-top box chassis and said removable module when said removable module is placed in said port; and
   integrally forming said at least one guide member in and from said chassis.

9. The method of claim 8, wherein said conducting thermal energy is performed with two guide members located on a top and bottom surfaces, respectively, of said removable module port.

10. The method of claim 8, further comprising attaching said at least one guide member to said chassis.

11. The method of claim 8, further comprising aligning and guiding said removable module into proper connection with a module connector in said port, said aligning and guiding being performed with said at least one guide member.

12. The method of claim 8, further comprising providing physical contact between said at least one guide member and said removable module that is extensive enough that a majority of heat generated by said removable module is dissipated through said at least one guide member.

13. The method of claim 8, further comprising placing a conductive paste between heat generating components of said module and an exterior housing of said module so as to provide a substantially uniform distribution of thermal energy on said exterior housing of said module.

14. A set-top box for use in a cable or satellite television system comprising:
   a set-top box chassis comprising a signal input for connecting said set-top box to said cable or satellite television system and a signal output for connecting said set-top box to a television;

circuitry housed in said chassis for processing a television signal received through said signal input and outputting a processed signal for use by a television set through said signal output;

a removable module port in said set-top box for receiving a removable module therein and electrically connecting said removable module to said circuitry of said set-top box, said removable module comprising processing capabilities that are used by said circuitry of said set-top box; and at least one guide member in said removable module port, said at least one guide member being in physical contact with said removable module when said removable module is disposed in said port;

wherein said at least one guide member is made of a thermally conductive material and provides a physical heat dissipation path from an exterior of said removable module to said set-top box chassis; and wherein said at least one guide member is integrally formed in and from said chassis.

15. The set-top box of claim 14, wherein said at least one guide member is two guide members located on a top and bottom surfaces, respectively, of said removable module port.

16. The set-top box of claim 14, wherein said at least one guide member is attached to said chassis.

17. The set-top box of claim 14, wherein said at least one guide member aligns and guides said removable module into proper connection with a module connector in said port.

18. The set-top box of claim 14, wherein said physical contact between said at least one guide member and said removable module is extensive enough that a majority of heat generated by said removable module is dissipated through said at least one guide member.

19. The set-top box of claim 14, wherein said removable module comprises a conductive paste between heat generating components of said module and an exterior housing of said module so as to provide a substantially uniform distribution of thermal energy on said exterior housing of said module.

* * * * *

UNITED STATES PATENT AND TRADEMARK OFFICE
CERTIFICATE OF CORRECTION

PATENT NO. : 6,771,503 B2  
DATED : August 3, 2004  
INVENTOR(S) : Kimball et al.

Page 1 of 1

It is certified that error appears in the above-identified patent and that said Letters Patent is hereby corrected as shown below:

<u>Title page,</u>
Item [75], Inventors, should read as follows:
-- [75]   Inventors:   Steven Kimball, Leucadia, CA (US);
                       Shlomo Ovadia, Yardley, CA (US);
                       … --

Signed and Sealed this

Sixteenth Day of November, 2004

JON W. DUDAS
*Director of the United States Patent and Trademark Office*